US006781417B1

United States Patent
Le et al.

(10) Patent No.: US 6,781,417 B1
(45) Date of Patent: Aug. 24, 2004

(54) BUFFER DRIVER CIRCUIT FOR PRODUCING A FAST, STABLE, AND ACCURATE REFERENCE VOLTAGE

(75) Inventors: Binh Quang Le, San Jose, CA (US); Lee Cleveland, Santa Clara, CA (US); Pau-Ling Chen, Saratoga, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/282,459

(22) Filed: Oct. 29, 2002

(51) Int. Cl.[7] ............................................. H03K 19/185
(52) U.S. Cl. .............................. 326/83; 326/17; 326/27
(58) Field of Search .......................... 326/17, 27, 83; 327/111, 530

(56) References Cited

U.S. PATENT DOCUMENTS 4,810,907 A * 3/1989 Tohyama ..................... 326/68
5,724,004 A * 3/1998 Reif et al. .................. 330/277

* cited by examiner

Primary Examiner—Daniel D. Chang
(74) Attorney, Agent, or Firm—Farjami & Farijami LLP

(57) ABSTRACT

According to one exemplary embodiment, a buffer circuit is configured to receive a supply voltage and an input reference voltage, the buffer circuit has a first FET operating in saturation region where the source of the first FET is coupled to the output reference voltage. The first FET can be configured, for example, as an open-loop voltage follower and, by way of example, a first resistor can be used to couple the source of the first FET to the output reference voltage. A tracking circuit is connected to the buffer circuit. The tracking circuit comprises a second FET also operating in saturation region where the drain of the second FET is coupled to the output reference voltage. Both the first and second FETs can be, for example, depletion mode transistors.

6 Claims, 4 Drawing Sheets

BUFFER DRIVER CIRCUIT FOR PRODUCING A FAST, STABLE, AND ACCURATE REFERENCE VOLTAGE

TECHNICAL FIELD

The present invention relates generally to the field of semiconductor devices. More particularly, the present invention relates to generation of a reference voltage in semiconductor devices.

BACKGROUND ART

Buffers are known in the art of circuit design for effectively isolating subcircuits within a system. For example, a buffer may be employed to prevent a later circuit from loading or putting excessive current drain on the signal source. In other cases, a source signal may be incapable of driving a later circuit having a large load, in which case a buffer may be employed to drive the later circuit.

Referring to FIG. 1, a conventional buffer circuit 100 employing operational amplifier 105 is generally shown. Operational amplifier 105 receives an input reference voltage (FVREF) 110 at its noninverting input and generates an output reference voltage (REF) 115. FVREF 110 can be any reference voltage, such as a bandgap reference voltage, for example. The output of operational amplifier 105 is tied to its inverting input to provide negative feedback loop 120. The arrangement of buffer circuit 100 is commonly referred to as a unity feedback amplifier. In operation, buffer circuit 100 is capable of driving a later circuit having a large load, such as capacitor $C_L$ 125, for example.

However, there are several problems associated with buffer circuit 100 as discussed herein with reference to FIG. 2. FIG. 2 generally shows a graph 200 depicting signal 210 representative of FVREF 110 and signal 215 representative of REF 115. Vertical axis 225 of graph 200 defines the voltage level of signals 210 and 215, while horizontal axis of graph 200 defines the time. As shown in graph 200, signal 215 (corresponding to REF 115) generated by operational amplifier 105 shows a significant delay in responding to the rapidly rising signal 210 (corresponding to FVREF 110). Thus, signal 215 (REF 115) does not closely follow a fast transition of signal 210 (FVREF 110).

Furthermore, signal 215 (REF 115) typically exhibits oscillations as shown in graph 200 due to negative feedback loop 120 of operational amplifier 105, especially if the operational amplifier has two or more stages and particularly when signal 215 (REF 115) is utilized to drive a large load. As a result, buffer circuit 100 tends to produce REF 115 having a slow and unstable response represented by signal 215 in graph 200. Accordingly, there exists a strong need in the art to overcome deficiencies of conventional buffer circuits, such as those described above, and to provide fast, stable, and accurate output reference voltages.

SUMMARY

The present invention addresses and resolves the need in the art for generating a fast, stable and accurate reference voltage for driving a large load. According to one exemplary embodiment, a buffer circuit is configured to receive a supply voltage and an input reference voltage, the buffer circuit has a first FET operating in saturation region where the source of the first FET is coupled to the output reference voltage. The first FET can be configured, for example, as an open-loop voltage follower and, by way of example, a first resistor can be used to couple the source of the first FET to the output reference voltage.

The exemplary embodiment also comprises a tracking circuit connected to the buffer circuit. The tracking circuit comprises a second FET also operating in saturation region where the drain of the second FET is coupled to the output reference voltage. Both the first and second FETs can be, for example, depletion mode transistors. In one embodiment, the gate of the first FET is coupled to the input reference voltage, the drain of the first FET is coupled to the supply voltage and the source of the first FET is coupled to the output reference voltage through a first resistor. In one embodiment, the gate of the second FET is coupled to the output reference voltage through a voltage divider, the source of the second FET is coupled to ground through, for example, a second resistor; and the drain of the second FET is coupled to the output reference voltage. Other features and advantages of the present invention will become more readily apparent to those of ordinary skill in the art after reviewing the following detailed description and accompanying drawings.

DETAILED DESCRIPTION OF THE INVENTION

The present invention is directed to a buffer driver circuit for producing a fast, stable, and accurate reference voltage. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 3:
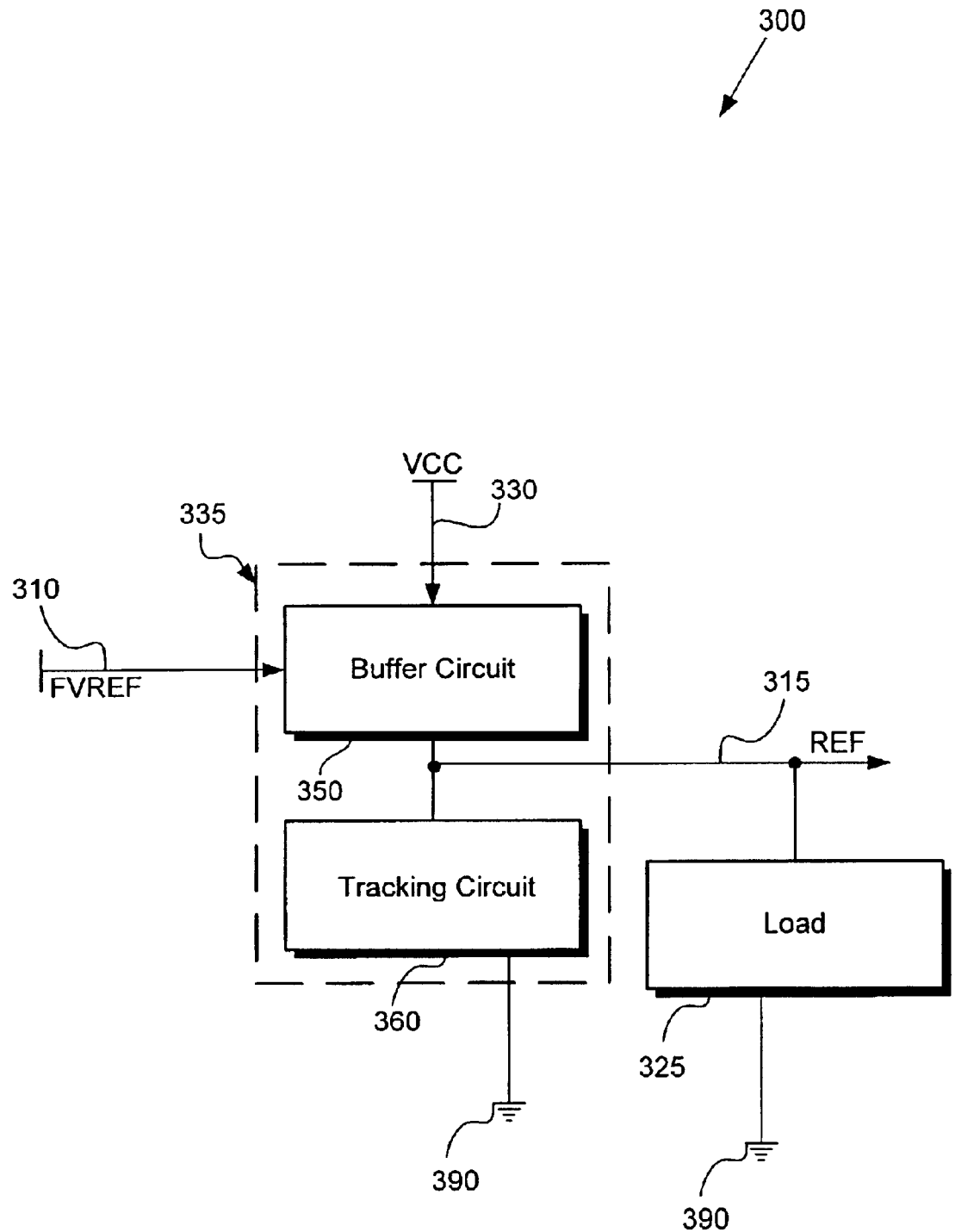
FIG. 3 depicts a block diagram of one embodiment of a buffer driver circuit in accordance with the present invention.

FIG. 3 depicts a block diagram of an illustrative buffer driver circuit 335 in accordance with an embodiment of the present invention. As shown in FIG. 3, buffer driver circuit 335 may be part of a larger circuit arrangement 300, such as a controller or memory device, for example. As such, buffer driver circuit 335 may be electrically connected to various other circuits and/or electrical components (not shown).

Buffer driver circuit 335 generally comprises a buffer circuit 350 coupled to a tracking circuit 360. Buffer circuit 350 is configured to receive a reference voltage signal (FVREF) 310 and a supply voltage (VCC) 330 and generate an output reference voltage (REF) 315 as described herein. Tracking circuit 360 is coupled to buffer circuit 350 and to ground 390.

FVREF 310 may be any reference voltage produced in circuit arrangement 300. In one embodiment, FVREF 310 is bandgap reference voltage. In general, FVREF 310 transitions upon detection of a predetermined event. For example, FVREF 310 may be turned on upon detection of a particular signal, such as an address transition, which, in turn, may correspond to a particular mode of operation. Upon detection of such signal, FVREF 310 produces a fast stable reference voltage, but typically has poor driving capabilities. As such, FVREF 310 is normally unsuitable for driving a large load. FVREF 310 is supplied to buffer circuit 350. Buffer driver circuit 335 could be designed such that VCC 330 supplying 1.6 Volts (V) and FVREF 310 supplying 0.9 V would yield a voltage level of approximately 0.7 V at REF 315 outputted by buffer driver circuit 335.

Figure 1:
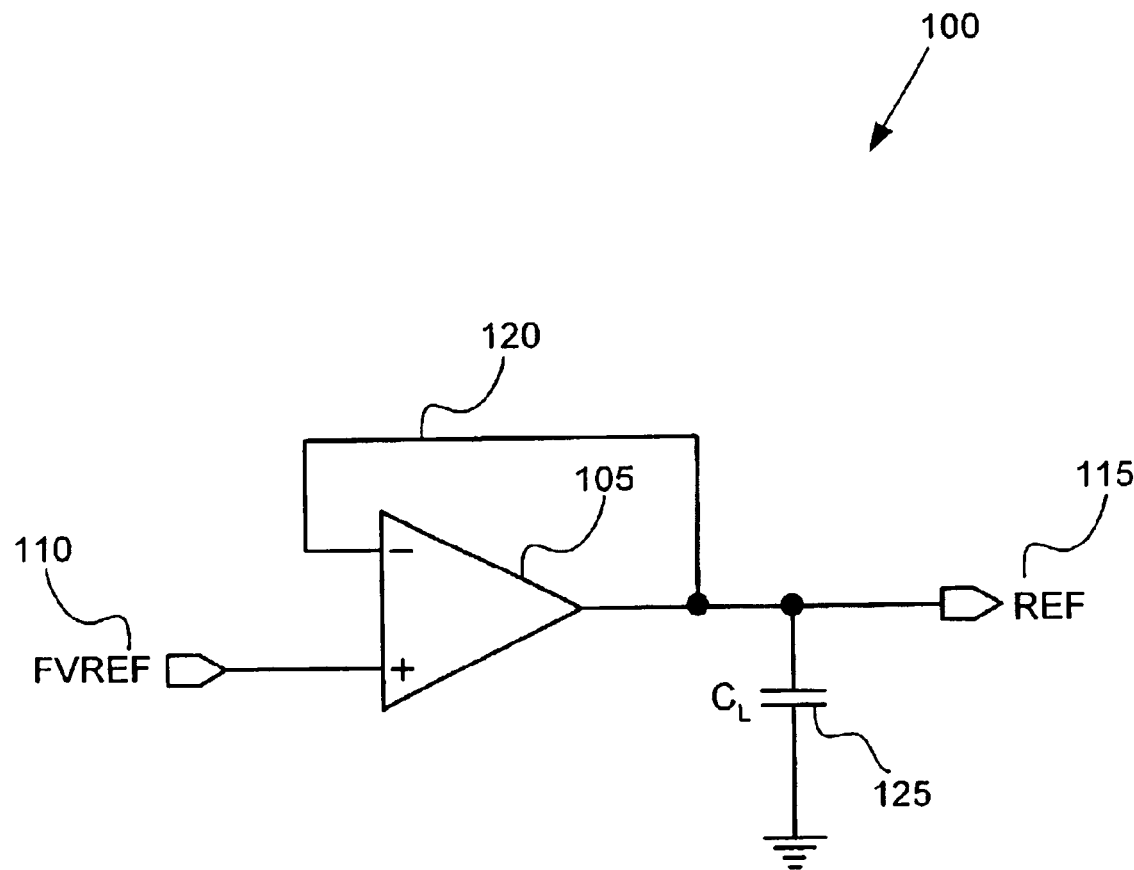
FIG. 1 depicts a circuit schematic of a conventional buffer circuit.
Figure 2:
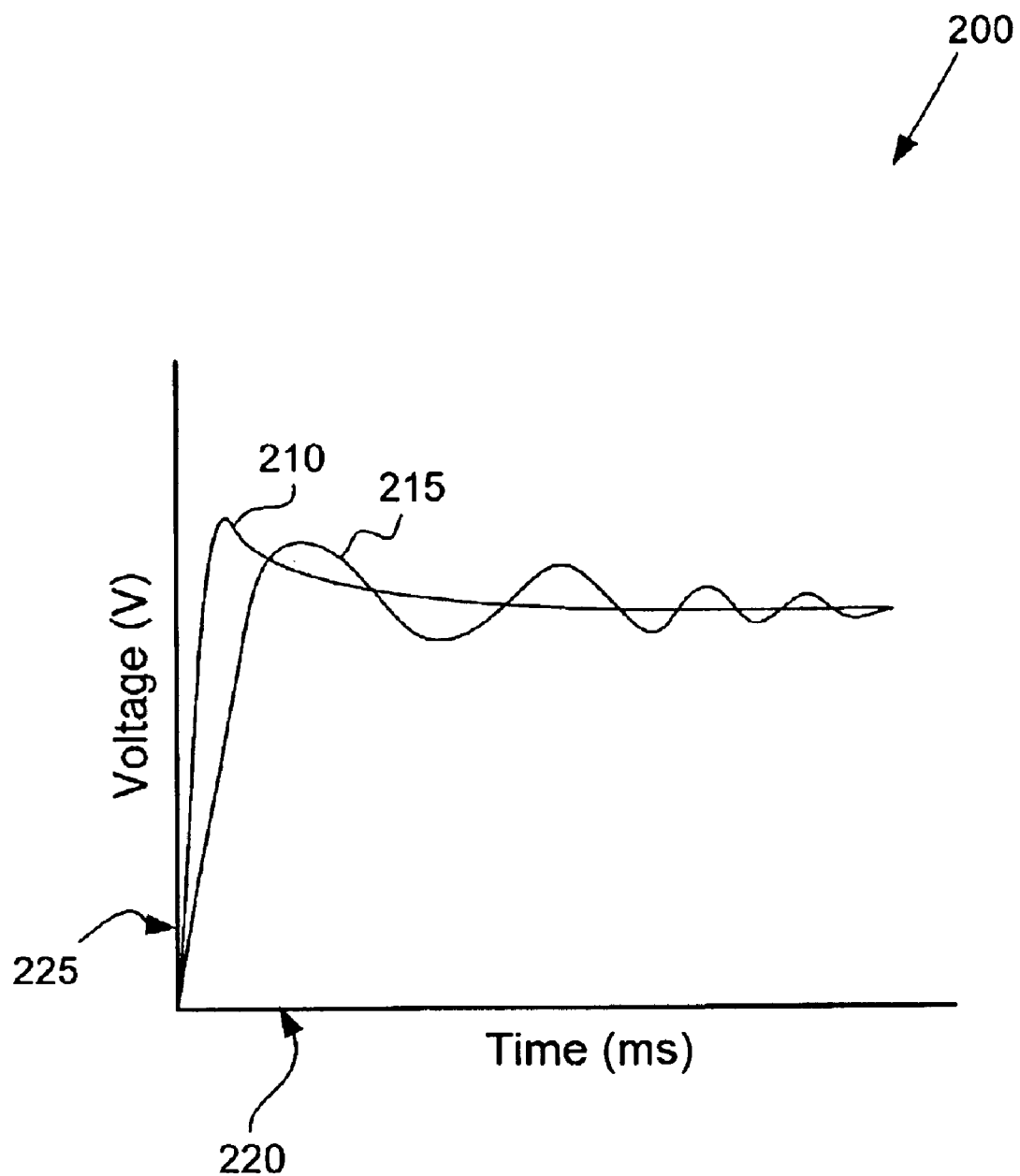
FIG. 2 is a graph depicting an input reference signal and an output reference signal received and produced, respectively, by the conventional buffer circuit of FIG. 1.
Figure 4:
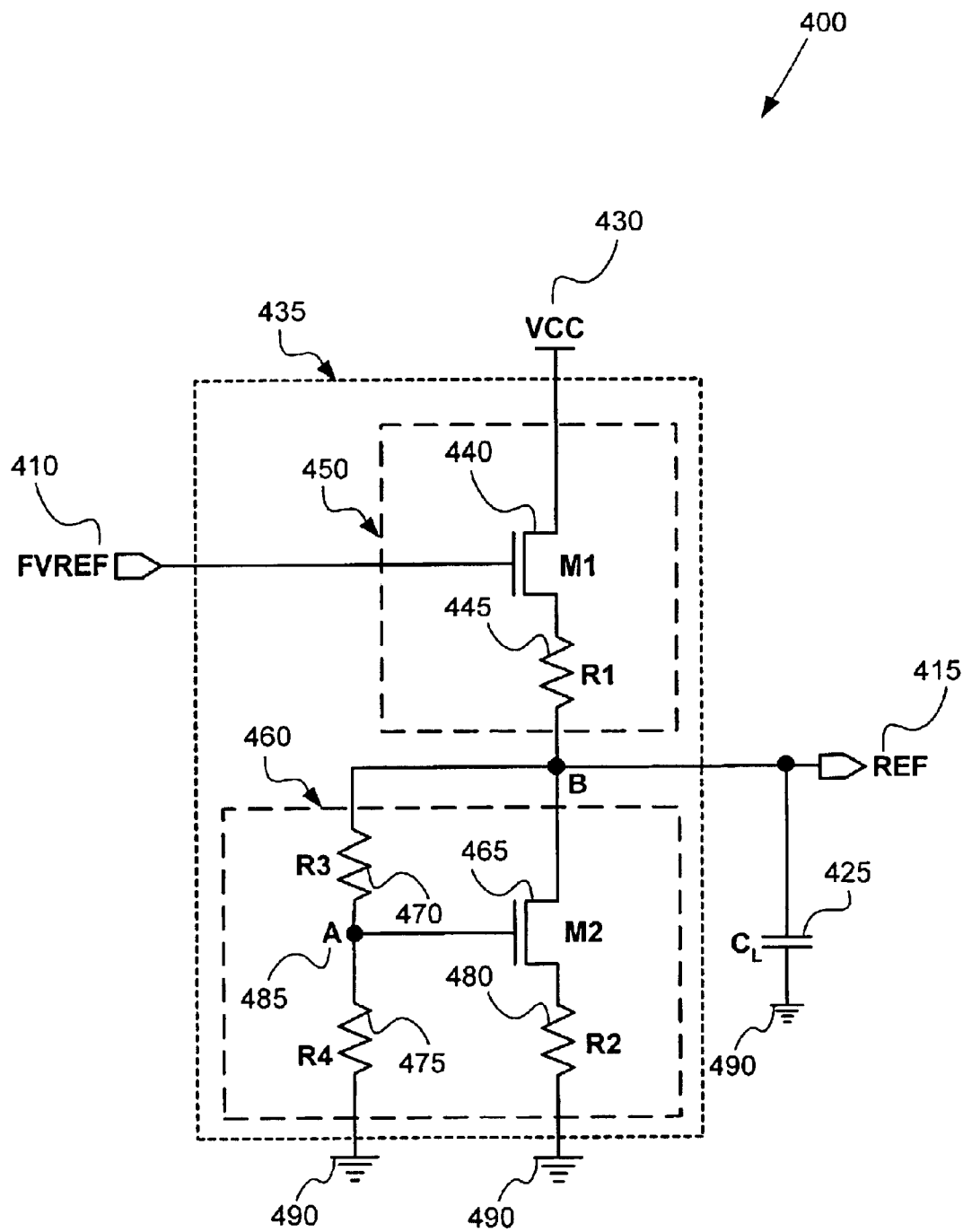
FIG. 4 depicts a circuit schematic of one embodiment of a buffer driver circuit in accordance with the present invention.

Buffer circuit 350 comprises circuitry configured to receive FVREF 310 and VCC 330 and produce REF 315 in conjunction with tracking circuit 360. Preferably, REF 315, produced by buffer circuit 350 in conjunction with tracking circuit 360, is a fast, stable, and accurate reference voltage which quickly follows a transition in FVREF 310, does not exhibit oscillations and does not vary in response to supply voltage, process, or temperature variations. Thus, in accordance with one embodiment of the present invention, buffer circuit 350 preferably comprises an open-loop voltage follower circuit. In this embodiment, buffer circuit 350 may comprise a suitable transistor to provide a voltage follower having an open loop configuration, such as a field effect transistor (FET) or other type of transistors. As illustrated in FIG. 4 and described in further detail below, a depletion mode FET may be used to provide an open-loop voltage follower in accordance with the present embodiment, where VCC 330 is supplied to the FET drain terminal, FVREF 310 is supplied to the FET gate terminal, and REF 315 is generated at the FET source terminal. With this configuration, and in conjunction with tracking circuit 360, buffer circuit 350 produces a stable REF 315 which quickly follows FVREF 310 and does not exhibit voltage oscillations as depicted in FIG. 2 and described above. Furthermore REF 315, configured as a voltage follower, is capable of driving a large load 325 such as a large capacitor. Moreover, as described below, buffer driver circuit 335, in conjunction with tracking circuit 360, produces a stable voltage which varies insignificantly with supply voltage, process or temperature variations.

Tracking circuit 360 is coupled to buffer circuit 350 and comprises circuitry configured to track changes affecting buffer circuit 350 to maintain an accurate, fast, and stable voltage level at REF 315. Tracking circuit 360 compensates for variations affecting buffer circuit 350, such as variations in process and temperature, for example. Thus, REF 315 supplies a relatively accurate, stable, and fast reference voltage substantially independent of variations affecting buffer circuit 350.

In accordance with one embodiment of the present invention, the same type of transistor utilized as a voltage follower in buffer circuit 350 is utilized in the tracking circuit 360. For example, a depletion mode FET may be used in tracking circuit 360 to track a depletion mode FET in buffer circuit 350, and compensate for process variations affecting the threshold voltages of all depletion mode transistors. Moreover, utilizing same type of transistors, such as depletion mode FETs, in both buffer circuit 350 and tracking circuit 360 results in compensation for other variations such as variations in temperature and process.

In accordance with another embodiment of the present invention, the depletion mode FETs in tracking circuit 360 are further configured to operate in the same mode as the FETs in buffer circuit 350. For example, a depletion mode FET provided in tracking 360 may be further configured to operate in the saturation region if a depletion mode FET provided in buffer circuit 350 is configured to operate in the saturation region.

Other elements may further be included in buffer circuit 350 and/or tracking circuit 360 in order to further enhance the stability and accuracy of output REF 315 of buffer driver circuit 335, without sacrificing its driving capability. For example, resistive elements may further be provided in order to reduce variations in current drawn from VCC 330 due to changes in process, temperature, and supply voltage.

In operation, buffer circuit 350 is supplied FVREF 310 and VCC 330. Upon transition of FVREF 310, buffer circuit 350 in conjunction with tracking circuit 360 generate REF 315 which quickly follows the transition of FVREF 310. REF 315 may be supplied to drive a large load 325. Tracking circuit 360 tracks process and temperature variations in buffer circuit 350 so that REF 315 provides an accurate and stable voltage. A specific exemplary implementation and details of operation of buffer driver circuit 335 are discussed below by reference to FIG. 4.

Referring now to FIG. 4 there is generally shown a circuit schematic of a buffer driver circuit 435 in accordance with one embodiment of the present invention. Buffer driver circuit 435 corresponds to buffer circuit driver 335 in FIG. 3 and may be a portion of a larger circuit arrangement 400, such as a controller or memory device, for example. Accordingly, buffer driver circuit 435 may be electrically connected to various other circuits and/or electrical components (not shown).

Buffer driver circuit 435 is configured to receive input reference voltage signal (FVREF) 410 and supply voltage (VCC) 430 and generate output reference voltage (REF) 415 as generally described above in conjunction with FIG. 3 and as described herein with reference to FIG. 4.

As previously described, FVREF 410 may be any reference voltage. In the present illustrative embodiment, FVREF 410 is a bandgap reference voltage which has a stable voltage and can, for example, be in the range of about 0.8 to 1.0 Volts (V) when used with a voltage divider. In general, FVREF 410 transitions upon detection of a predetermined event. For example, FVREF 410 may be turned on upon detection of a particular signal, such as an address transition, which, in turn, may correspond to a particular mode of operation (e.g., a read mode). Upon detection of such signal, FVREF 410 produces a fast and stable reference voltage signal, but typically has poor driving capabilities. As such, FVREF 410 is normally unsuitable for driving a large load, such as capacitor $C_L$ 425. As shown in FIG. 4, FVREF 410 is supplied to buffer circuit 450. In the present illustrative embodiment, VCC 430 provides a supply voltage in a range of about 1.6 to 2.0 V.

Referring now to the details of buffer driver circuit 435, buffer driver circuit 435 comprises buffer circuit 450 and tracking circuit 460. In the particular embodiment depicted in FIG. 4, buffer circuit 450 includes an n-channel FET (NFET) M1 440 operating as a voltage follower, such as a depletion mode NFET, for example. Supply voltage VCC 430 is supplied to the drain terminal of transistor M1 440. Reference voltage FVREF 410 is supplied to the gate terminal of transistor M1 440. The source terminal of transistor M1 440 is tied to one end of resistor R1 445, while the other end of resistor R1 445 is connected to node B to generate reference voltage REF 415. Configured as such, buffer circuit 435 operates as a voltage follower capable of driving a large load (e.g., $C_L$ 425) and supplies a voltage which is stable (e.g., non-oscillatory) and fast (e.g., quickly follows transitions in FVREF 410). In the present example, REF 415 supplies a voltage level in the range of about 0.7 to 0.9 V.

However, due to variations, such as variations in supply voltage VCC 430, process, and temperature, the threshold voltage (VT) of transistor M1 440 may have a range varying from about 0.4 V to 0.05 V. In the absence of tracking circuit 460 and resistor R1 445, such threshold voltage variation normally translates to an REF 415 having an accuracy no better than about 450 milliVolts (mV) since current conduction of transistor M1 440 is dependent upon its gate-to-source voltage ($V_{GS}$) exceeding $V_T$. Since FVREF 410, which is the gate voltage of transistor M1 440, is a relatively constant reference voltage, a 450 mV variation in $V_T$ generally translates to a 450 mV variation in REF 415. The reason is that when $V_T$ of transistor M1 440 varies 450 mV, the source voltage of the transistor would have to vary by the same amount in order to maintain $V_{GS}$ at a relatively constant level to achieve the same level of current conduction in transistor M1 440.

A 450 mV variation is unacceptable for a reference voltage (i.e. REF 415), particularly when a relatively constant voltage of between 700 to 900 mV is sought at REF 415. However, as described in more detail below, in accordance with the present invention, tracking circuit 460 along with resistor R1 445 significantly improve the stability and accuracy of REF 415 while maintaining the desired voltage level and responsiveness of REF 415 during operation. As described below, tracking circuit 460 along with resistor R1 445 compensate for process and temperature variations.

In accordance with the present embodiment, the same type of transistor used as a voltage follower in buffer circuit 450 is utilized in tracking circuit 460. Accordingly, tracking circuit 460 includes a depletion mode NFET transistor M2 465 having the same threshold voltage as transistor M1 440. The drain terminal of transistor M2 465 is connected to REF 415 at node B. The gate terminal of transistor M2 465 at node A 485 is connected to REF 415 through resistor R3 470. The gate terminal of transistor M2 465 is also connected to one end of resistor R4 475, while the other end of resistor R4 475 is connected to ground 490. The source terminal of transistor M2 465 is tied to one end of resistor R2 480, while the other end of resistor R2 480 is connected to ground 490.

In operation, the $V_T$ of transistor M2 465 tracks the variations in $V_T$ of transistor M1 440 in response to variations in process and temperature. As noted above, the $V_T$ of transistor M1 440 may vary from about −0.4 V to 0.05 V. Likewise, $V_T$ of transistor M2 465 would vary from about −0.4 V to 0.05 V. Thus, when $V_T$ of transistor M1 440 is low, e.g. close to −0.4 V, transistor M1 440 conducts more current which acts to increase the voltage at REF 415. However, since the $V_T$ of transistor M2 465 is similarly low, transistor M2 465 also conducts more current which acts to decrease the voltage at REF 415. The net result is that the voltage at REF 415 remains relatively constant despite process and temperature variations decreasing the threshold voltage of transistor M1 440. Conversely, when $V_T$ of transistor M1 440 is high, e.g. close to 0.05 V, transistor M1 440 conducts less current which acts to decrease the voltage at REF 415. However, since the $V_T$ of transistor M2 465 is similarly high, transistor M2 465 also conducts less current which acts to increase the voltage at REF 415. The net result is that the voltage at REF 415 remains relatively constant despite process and temperature variations increasing the threshold voltage of transistor M1 440.

Moreover, according to another feature of the present embodiment, the configuration of tracking circuit 460 in FIG. 4 forces transistor M2 465 to operate in the same operating region as transistor M1 440. Configured in the manner shown in FIG. 4, transistor M1 440 of buffer circuit 450 operates only in saturation region. A FET operates in the saturation region when the following equation is satisfied:

$$V_{GS} < V_{DS} + V_T \qquad \text{Equation (1)}$$

where $V_{DS}$ is the drain-to-source voltage, $V_{GS}$ is the gate-to-source voltage, and $V_T$ is the threshold voltage. In the exemplary configuration of buffer circuit 450, $V_{GS}$ of depletion mode transistor M1 440 is always less than the sum of its $V_{DS}$ and $V_T$. The reason is that, as stated above, VCC is between 1.6 and 2.0 V while FVREF is about 0.9 V. As such, the drain voltage is at least 0.7 volts greater than the gate voltage of transistor M1 440. However, the smallest value of $V_T$ is −0.4 V. As such, the sum of $V_{DS}$ and $V_T$ is always greater than $V_{GS}$ by at least 0.3 V and thus equation (1) is always satisfied and depletion mode transistor M1 440 always operates in the saturation region.

Similarly, the configuration of tracking circuit 460 forces depletion mode transistor M2 465 to operate in the saturation region only, thereby causing transistor M2 465 to better track the operation of transistor M1 440. More particularly, the relation between the voltage at gate terminal of transistor M2 465 at node A 485 ($V_{node\ A}$) and the voltage at the drain terminal of transistor M2 465 at node B ($V_{node\ B}$) is given by the equation:

$$V_{node\ A} = (R4 * V_{node\ B})/(R3 + R4) \qquad \text{Equation (2)}$$

since resistors R3 470 and R4 475 act as a voltage divider across node B ($V_{node\ B}$) (i.e., REF 415) and ground 490. Thus, values for resistor R3 470 and R4 475 may be selected using equation (2) so that equation (1) is satisfied for transistor M2 465 in all cases. For example, if it is desired that the voltage at REF 415 be 0.7 V, the values of resistors R3 470 and R4 475 can be selected such that the voltage at node A 485 is 0.2 V. As such, the drain voltage of transistor M2 465 will be 0.5 V greater than its gate voltage. Since the smallest $V_T$ of transistor M2 465 is −0.4 V, the sum of $V_{DS}$ and $V_T$ is always greater than $V_{GS}$ by at least 0.1 V and thus equation (1) is always satisfied and depletion mode transistor M2 465 always operates in the saturation region in the configuration of tracking circuit 460 in FIG. 4. Since the configurations of tracking circuit 460 as well as buffer circuit 450 ensure that both transistors M1 440 and M2 465 operate in saturation regions, transistor M2 465 is able to more accurately track variations in current conduction of transistor M1 440 in response to changes in process and temperature.

According to another feature of the present embodiment, values of resistors R1 445 and R2 480 are selected to reduce variations in current drawn by transistor M1 440 of buffer circuit 450 and transistor M2 465 of tracking circuit 460. For example, each of resistors R1 445 and R2 480 may have a value in a range from about 1.0 to 2.0 kilo Ohms (kΩ). Since current from VCC 430 to ground 490 is reduced due to degenerate resistors R1 445 and R2 480, changes in threshold voltages of transistors M1 440 and M2 465 will have a lower impact on the total current passing from VCC 430 to ground 490 through transistor M1 440, resistor R1 445, transistor M2 465, and resistor R2 480. As such, the voltages at various nodes, such as node B, would be more stable.

In sum, buffer circuit 450 is supplied FVREF 410. Upon transition of FVREF 410, buffer circuit 450 generates REF 415 which quickly follows transition of FVREF 410. Tracking circuit 460 tracks process and temperature variations affecting buffer circuit 450 so that REF 415 maintains an accurate and stable voltage level. Since transistor M1 440 is a relatively large transistor, REF 415 may be utilized to drive a large load (e.g., $C_L$ 425). Buffer driver circuit 435 may be utilized in any portion of circuit arrangement 400 to provide a fast, accurate, and stable REF 415 as described above. As described above, buffer driver circuit 435, comprising the voltage follower configuration used in buffer circuit 450 and tracking circuit 460, achieves the fast, accurate, and stable output reference voltage REF 415 where output reference voltage REF 415 is substantially independent of supply voltage, process, and temperature variations.

From the above description of exemplary embodiments of the invention it is manifest that various techniques can be used for implementing the concepts of the present invention without departing from its scope. Moreover, while the invention has been described with specific reference to certain embodiments, a person of ordinary skill in the an would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a buffer driver circuit for producing a fast, stable, and accurate reference voltage has been described.

What is claimed is:

1. A buffer driver circuit for generating an output reference voltage comprising:

a buffer circuit configured to receive a supply voltage and an input reference voltage, said buffer circuit having a first FET operating in saturation region, said first PET having a source coupled to said output reference voltage; and a tracking circuit connected to said buffer circuit, said tracking circuit comprising a second FET operating in saturation region, said second FET having a drain coupled to said output reference voltage, wherein said first FET and said second FET are depletion mode transistors.

2. A buffer driver circuit for generating an output reference voltage comprising:

a buffer circuit configured to receive a supply voltage and an input reference voltage, said buffer circuit having a first FET operating in saturation region, said first FET having a source coupled to said output reference voltage;

a tracking circuit connected to said buffer circuit, said tracking circuit comprising a second FET operating in saturation region, said second FET having a drain coupled to said output reference voltage; and wherein a gate of said second FET is coupled to said output reference voltage through a voltage divider, a source of said second FET is coupled to ground, and said drain of said second FET is coupled to said output reference voltage.

3. A buffer driver circuit for generating an output reference voltage comprising:

a buffer circuit configured to receive a supply voltage and an input reference voltage, said buffer circuit having a first FET operating in saturation region, said first FET having a source coupled to said output reference voltage; and a tracking circuit connected to said buffer circuit, said tracking circuit comprising a second FET operating in saturation region, said second FET having a drain coupled to said output reference voltage, wherein a source of said second FET is coupled to ground through a resistor.

4. A buffer driver circuit for generating an output reference voltage comprising:

buffering means for receiving a supply voltage and an input reference voltage, said buffering means having a first FET operating in saturation region, said first FET having a source coupled to said output reference voltage; and tracking means connected to said buffering means, said tracking means comprising a second FET operating in saturation region, said second FET having a drain coupled to said output reference voltage, wherein said first FET and said second FET are depletion mode transistors.

5. A buffer driver circuit for generating an output reference voltage comprising:

buffering means for receiving a supply voltage and an input reference voltage, said buffering means having a first FET operating in saturation region, said first FET having a source coupled to said, output reference voltage; and tracking means connected to said buffering means, said tracking means comprising a second FET operating in saturation region, said second FET having a drain coupled to said output reference voltage; and wherein a gate of said second FET is coupled to said output reference voltage through a voltage divider, a source of said second FET is coupled to ground, and said drain of said second FET is coupled to said output reference voltage.

6. A buffer driver circuit for generating an output reference voltage comprising:

buffering means receiving a supply voltage and an input reference voltage, said buffering means having a first FET operating in saturation region, said first FET having a source coupled to said output reference voltage; and tracking means connected to said buffering means, said tracking means comprising a second FET operating in saturation region, said second FET having a drain coupled to said output reference voltage, wherein a source of said second FET is coupled to ground through a resistor.

* * * * *